(12) United States Patent
McGrath, Jr. et al.

(10) Patent No.: US 10,228,390 B2
(45) Date of Patent: Mar. 12, 2019

(54) CABLE ASSEMBLY WITH SPINE FOR INSTRUMENT PROBE

(71) Applicant: Tektronix, Inc., Beaverton, OR (US)

(72) Inventors: James H. McGrath, Jr., Aloha, OR (US); David Thomas Engquist, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 223 days.

(21) Appl. No.: 14/823,903

(22) Filed: Aug. 11, 2015

(65) Prior Publication Data
US 2017/0045550 A1    Feb. 16, 2017

(51) Int. Cl.
*G01R 1/04* (2006.01)
*G01R 1/067* (2006.01)
*G01R 31/28* (2006.01)
*H02G 1/14* (2006.01)

(52) U.S. Cl.
CPC ....... *G01R 1/0416* (2013.01); *G01R 1/06788* (2013.01); *G01R 31/2884* (2013.01); *H02G 1/14* (2013.01)

(58) Field of Classification Search
CPC .. G02B 6/4471; G02B 6/4476; G02B 6/4477; G02B 6/4478; G02B 6/4429; G02B 6/4433; G02B 6/3887; G01R 1/0416; G01R 1/06788; G01R 31/2884; H01B 7/24; H01B 7/04; H01B 7/18; H01B 7/184;
(Continued)

(56) References Cited

U.S. PATENT DOCUMENTS

| 6,169,834 B1* | 1/2001 | Keller | H01B 11/22 385/101 |
| 7,270,485 B1* | 9/2007 | Robinson | G02B 6/4477 385/136 |
| 9,404,940 B1* | 8/2016 | Campbell | G01R 1/06788 |

(Continued)

FOREIGN PATENT DOCUMENTS

DE    202010009369 U1    9/2010

OTHER PUBLICATIONS

Extended European Search Report issued in European Patent Application No. 16183615.0, dated Nov. 11, 2016, 6 pages.

*Primary Examiner* — Jeff W Natalini
*Assistant Examiner* — Steven L Yeninas
(74) *Attorney, Agent, or Firm* — Miller Nash Graham & Dunn; Andrew J. Harrington

(57) ABSTRACT

Embodiments of the present invention provide an improved cable assembly for connecting an electrical test and measurement probe to a device under test. One end of the probe is connected to a device under test ("DUT"), while the other end is connected to the instrument through one or more cables. To prevent mechanical stresses to the probe-DUT interface caused by the cables' resistance to bending and twisting, embodiments of the improved cable assembly use one or more pliable spines to hold the cable assembly in position after it has been bent or twisted. This provides a more secure connection to the DUT and prevents damage to the probe-DUT interface. Each spine is anchored to the tip of the probe, and may be further secured by an outer housing or additional anchors. A flexible boot may surround the cable assembly and/or outer housing, further protecting the cables from damage. Alternatively, one or more spines may be placed inside the boot.

12 Claims, 4 Drawing Sheets

(58) Field of Classification Search
CPC ...... H02G 1/14; H02G 15/007; H01R 13/562; H01R 13/565
USPC ....... 324/756.05, 765.05; 385/103, 107, 113, 385/136; 439/449, 452, 464, 350, 447, 439/448, 459
See application file for complete search history.

(56) References Cited

U.S. PATENT DOCUMENTS

| | | | |
|---|---|---|---|
| 2004/0165853 A1* | 8/2004 | Matsueda | G02B 6/4428 385/136 |
| 2004/0182170 A1 | 9/2004 | Harju | |
| 2005/0053342 A1* | 3/2005 | Melton | G02B 6/4471 385/113 |
| 2005/0162147 A1* | 7/2005 | Cannon | H01R 13/625 324/72.5 |
| 2008/0008430 A1* | 1/2008 | Kewitsch | G02B 6/4478 385/113 |
| 2008/0247720 A1* | 10/2008 | Cody | G02B 6/4475 385/114 |
| 2008/0250632 A1* | 10/2008 | Dayton | H01B 7/40 29/825 |
| 2009/0204118 A1* | 8/2009 | Pratt | A61B 17/82 606/74 |
| 2010/0027955 A1* | 2/2010 | Parikh | G02B 6/4477 385/135 |
| 2010/0186989 A1* | 7/2010 | Alvelo | H01B 7/18 174/113 R |
| 2012/0153980 A1 | 6/2012 | Wu et al. | |
| 2013/0033280 A1* | 2/2013 | Engquist | G01R 1/06733 324/755.01 |
| 2013/0056267 A1* | 3/2013 | Hatton | H01B 7/0869 174/74 R |
| 2016/0172076 A1* | 6/2016 | Hess | H01B 1/026 385/100 |

* cited by examiner

CABLE ASSEMBLY WITH SPINE FOR INSTRUMENT PROBE

FIELD OF THE INVENTION

The present invention relates to an improved cable assembly for electrical test and measurement instrument probes.

BACKGROUND OF THE INVENTION

Electrical test and measurement instruments such as oscilloscopes use a probe to interface with the device under test ("DUT"). The probe connects the DUT to the instrument, through a cable. The DUT often cannot be directly lined up with the instrument, causing the cable to bend or twist. The cable typically resists being bent or twisted, which introduces mechanical stresses to the interface between the probe and the DUT. These stresses can compromise the probe's connection to the DUT or even damage the interface.

Previous attempts to eliminate these stresses have involved securing the probe tip to the DUT, or securing the cables so that they cannot impart any mechanical stress to the DUT. For example, securing the probe tip to the DUT using tape or glue, or anchoring the cable to a stationary point near the DUT. These solutions, however, require extra work when connecting the probe to the DUT. They also prevent the probe from being easily disconnected when another device needs to be tested. Some solutions may even damage the interface between the probe and DUT when the probe is disconnected.

Attempts have also been made to manufacture a cable with an outer jacket material that makes the cable more formable. This reduces some, but not all of the cable's resistance to twisting. And because the formable outer jacket does not protect the cable as well against damage, the performance of these cables tends to deteriorate over time.

Thus, there is a need for a cable assembly that will eliminate the mechanical stresses to the DUT interface that are caused by the cable's resistance to bending and twisting, while protecting the cable from damage.

SUMMARY OF THE INVENTION

Embodiments of the present invention provide an improved probe cable assembly for electrical test and measurement instruments that reduces mechanical stresses normally caused by the cable's resistance to bending and twisting. A pliable spine holds the cable assembly in position after it has been bent or twisted, preventing mechanical stresses to the probe's interface with the device under test. A flexible boot surrounds the cable assembly, allowing it to bend and twist within a range of motion that will not damage the assembly.

The objects, advantages, and other novel features of the present invention are apparent from the following detailed description when read in conjunction with the appended claims and attached drawings.

DETAILED DESCRIPTION OF THE INVENTION

In order to measure signals in a device under test ("DUT"), test and measurement instruments such as oscilloscopes use a probe to connect to the device. The probe connects to the instrument via one or more signal cables. Usually, the DUT and instrument cannot be lined up perfectly, and the cables must be bent or twisted into position.

Unfortunately, the cables used in electrical test and measurement instruments typically resist bending and twisting. For example, coaxial cable (also referred to as "coax") is commonly used because it shields the test and measurement signals from electrical interference and resists being crushed. Once it is bent or twisted, however, most coax will attempt to return to its original position. This imparts mechanical stresses to the interface between the probe and DUT.

These mechanical stresses can compromise the integrity of the connection, or worse, damage the interface. Both can occur easily when the probe is attached to a small or fragile DUT interface. For example, some interfaces may consist of one or more delicate 0.004 inch diameter wires that connect the probe to the device.

Accordingly, embodiments of the present invention provide an improved test probe cable assembly that retains its position after being bent or twisted thus imparting fewer mechanical stresses to the probe-DUT interface.

Figure 1:
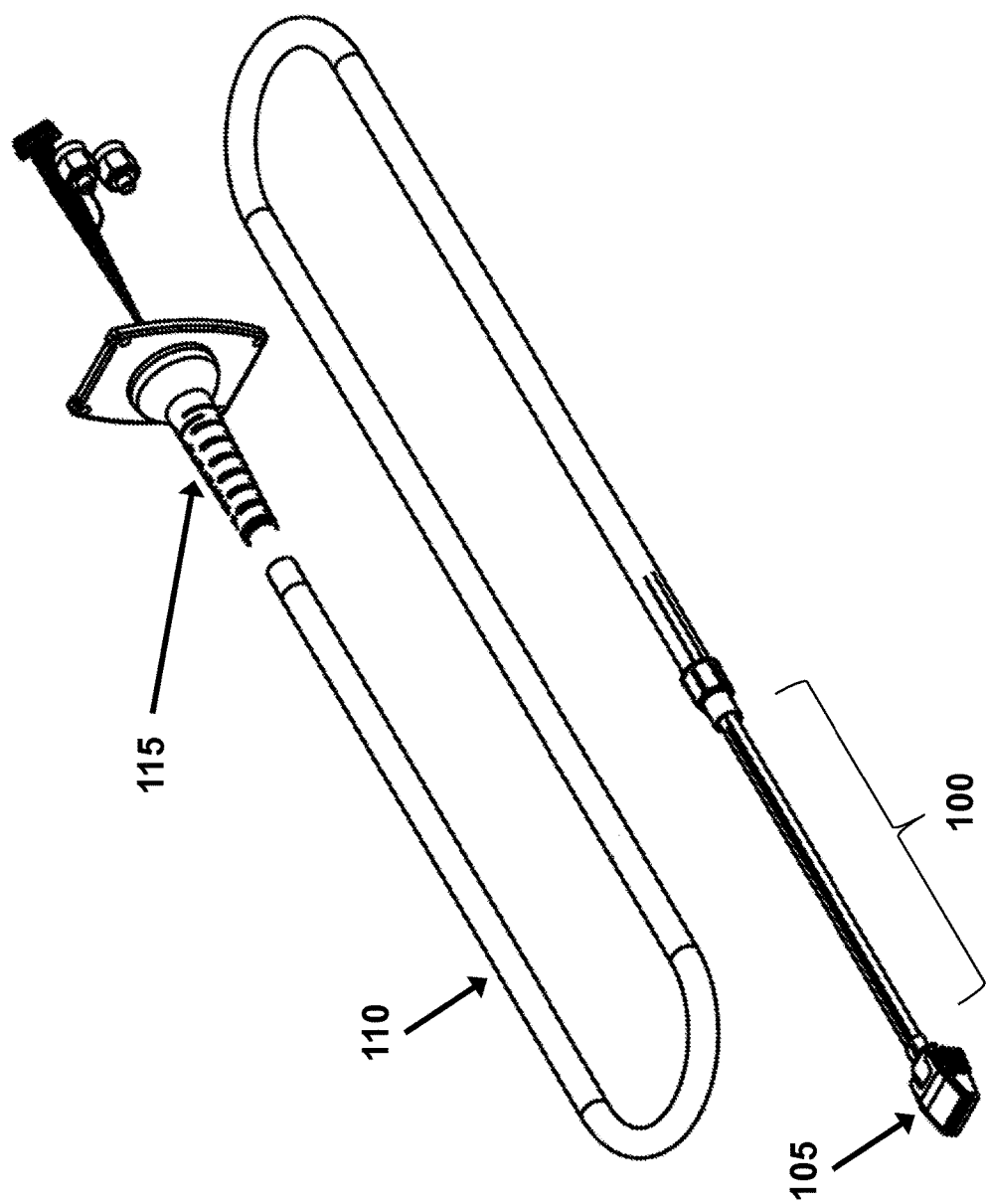
FIG. 1 depicts an exemplary embodiment of a probe with cable assembly, instrument cable, and instrument interface

FIG. 1 depicts an exemplary embodiment of a cable assembly 100 that connects a probe tip 105 to an instrument interface 115 through instrument cable 110. In most embodiments, cable assembly 100 only needs to be a few inches long to relieve mechanical stresses from the cable. This can be useful, for example, when the instrument cable 110 needs to have a strong outer shield to protect it from electrical interference or mechanical damage. Cable assembly 100 may be longer in other embodiments, however. For example, when a strong outer shield is not as important. In some embodiments, cable assembly 100 may connect the probe tip 105 directly to the instrument interface 115, without instrument cable 110.

Figure 2:
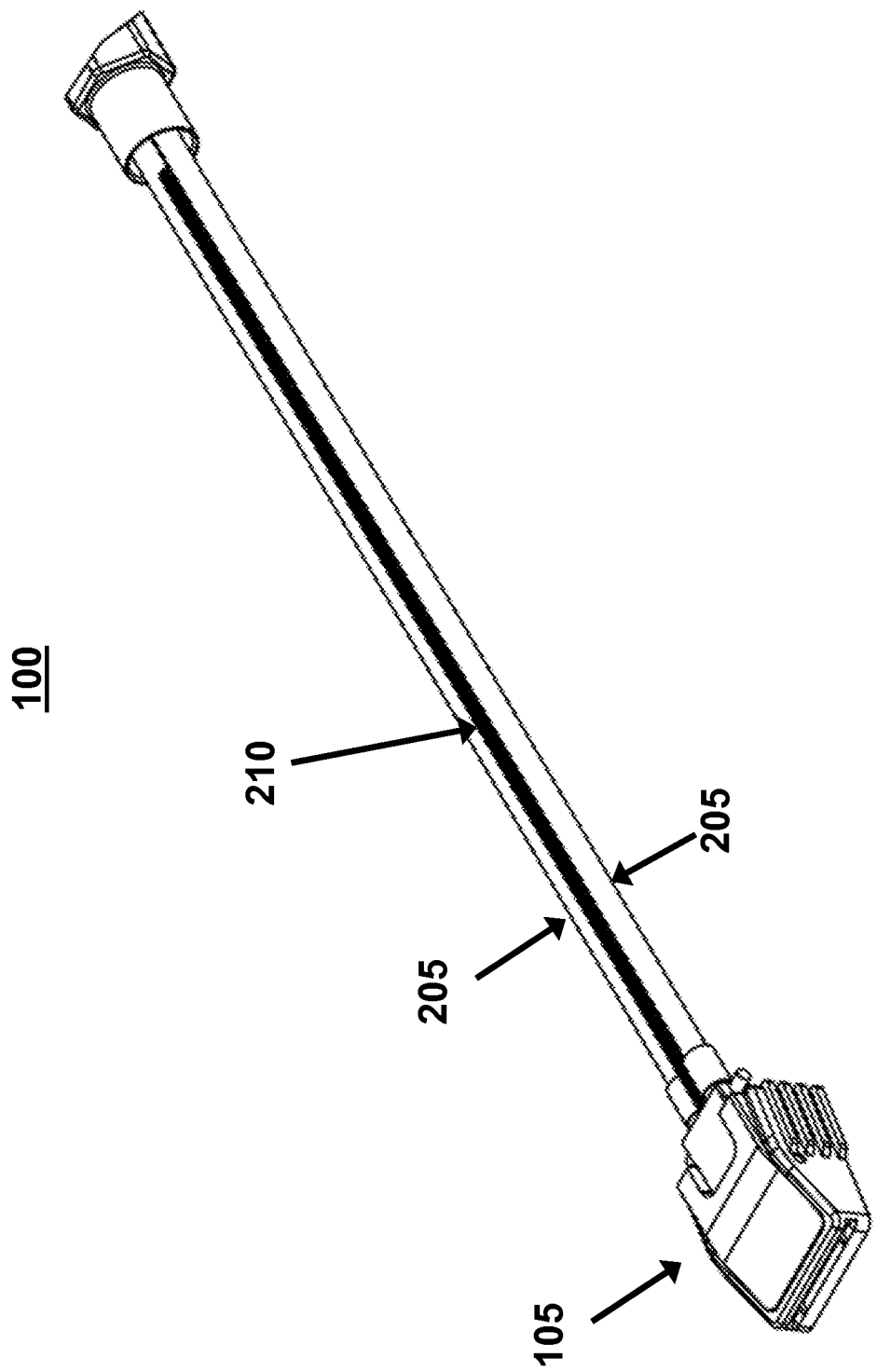
FIG. 2 depicts an exemplary embodiment of a probe cable assembly

In one embodiment, cable assembly 100 may comprise one or more signal cables 205 and a spine 210, as shown in FIG. 2. Each of signal cables 205 carries information between the probe tip 105 and a test or measurement instrument. In one embodiment, signal cables 205 may be coaxial cables, however any suitable type of cables known in the art, such as triaxial or optical cables may also be used.

Spine 210 counteracts the signal cables' resistance to bending and twisting, which allows the cable assembly 100 to remain in position without adding mechanical stress to the DUT-probe interface. Spine 210 is normally selected from an appropriate gauge and material to counteract the properties of signal cables 205. For example, in one embodiment the pliable spine 210 may consist of a copper 20 AWG (American Wire Gauge) dead-soft wire. In some cases, however, users may prefer a stiffer spine. This could reassure the user that the cable assembly will eliminate cable stresses. Other users may prefer a softer spine for applications where flexibility is more important and cable stresses are not as much of a concern. For example, when connecting the probe to a more robust DUT interface. Thus, in some embodiments spine 210 may be softer or stiffer in order to provide the user with a desired cable feel.

An anchor at probe tip 105 may be used to secure spine 210 and prevent it from moving with respect to the probe tip 105. In one embodiment, the anchor may be a U-shaped bend in spine 210 that loops around a section of probe tip 105. In other embodiments, the anchor may comprise an L-shaped section of spine that is received by a hole or slot in probe tip 105. Any other suitable anchor mechanisms known in the art to secure spine 210 to probe tip 105 may also be used.

Figure 3:
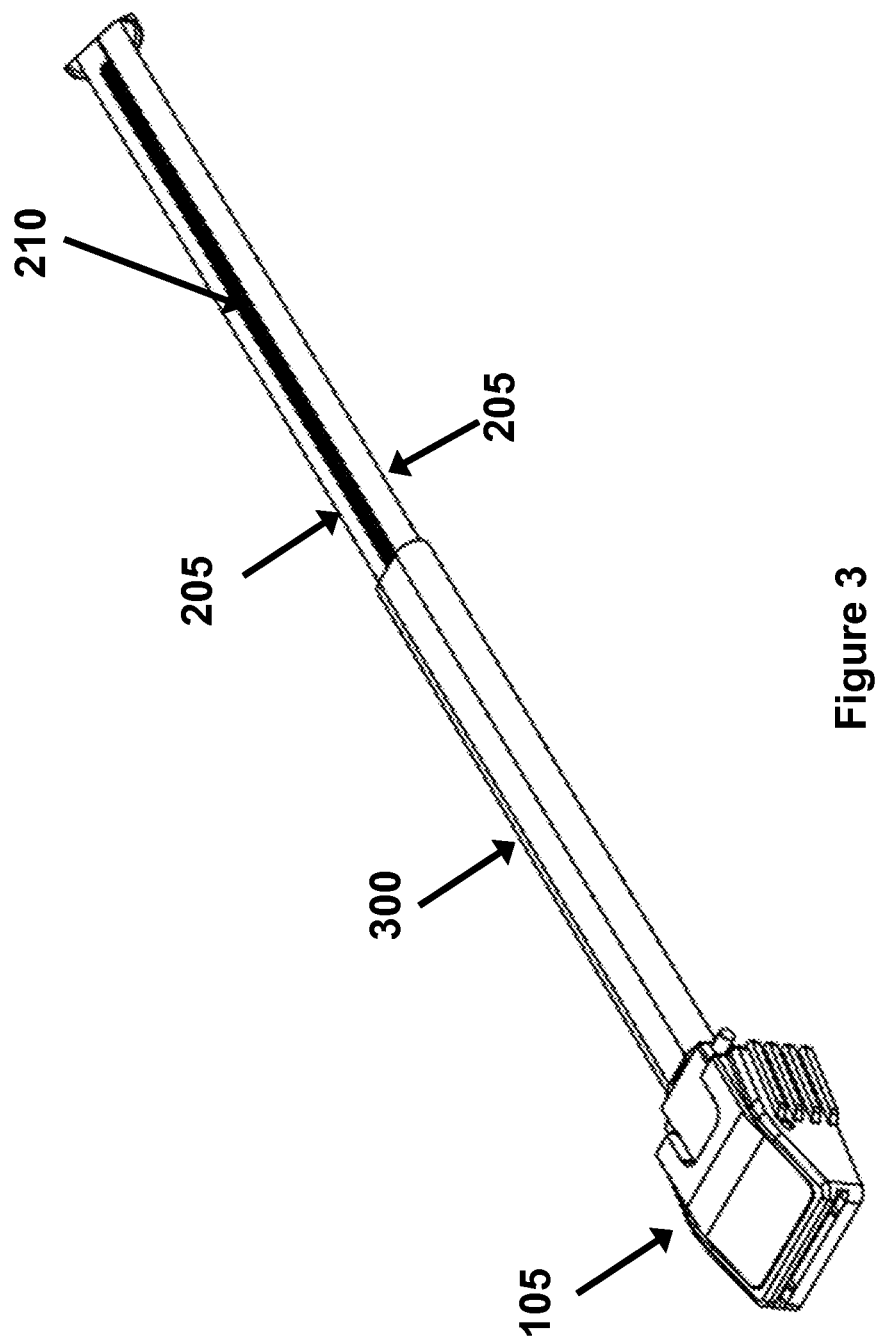
FIG. 3 depicts an exemplary embodiment of a probe cable assembly with a flexible jacket

As shown in FIG. 3, the cable assembly 100 may be enclosed in a flexible housing 300. Housing 300 secures spine 210 with respect to signal cables 205. For embodiments in which spine 210 is electrically conductive, housing 300 may also act as an insulator. In one embodiment, housing 300 may be heat shrink tubing, however any other suitable material or securing system may also be used. For example, in some embodiments housing 300 may comprise tape, fitted tubing, one or more ties, clamps, etc. In some embodiments, one or more additional anchors or bends in spine 210 may be added to prevent signal cables 205 from moving with respect to spine 210.

Figure 4:
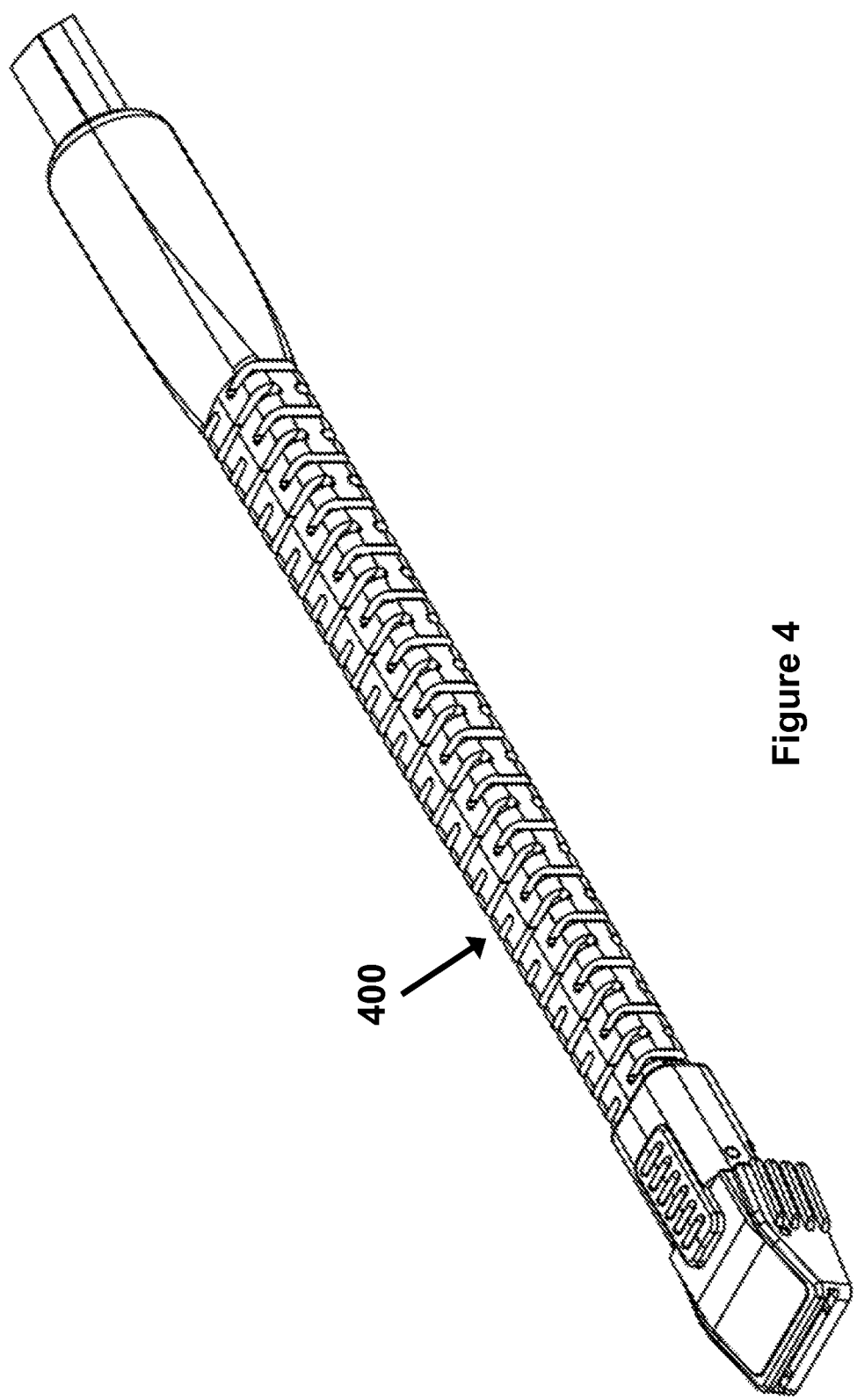
FIG. 4 depicts an exemplary embodiment of a flexible boot

FIG. 4 shows one embodiment of a flexible boot 400 that covers housing 300 and cable assembly 100. Sections of boot 400 are cut out in order to allow the boot to flex, while preventing the boot from flexing too far. This protects the signal cables 205 from damage that could occur if they were bent too sharply. The diameter of boot 400 reduces towards the probe tip 105, which allows the cable assembly 100 to have the greatest range of motion at the probe tip 105.

In FIG. 2, spine 210 is depicted as a single wire running down the center of cable assembly 100. In other embodiments, however, spine 210 may comprise any appropriate shape such as flat, concave, or more complex shapes. Spine 210 may also be located inside of boot 400. For example, spine 210 may be inserted into a hole or channel inside boot 400. In other embodiments, spine 210 may be molded directly into boot 400. These embodiments might eliminate the need for housing 300, which could reduce cost and make cable assembly 100 more flexible. These embodiments might also allow spine 210 and boot 400 to be added to existing probe cables, improving those cables for minimal cost.

Although FIGS. 1-4 depict an embodiment in which two signal cables 205 are used, spine 210 may also be used with any number of signal cables. For example, spine 210 may be used with a cable assembly that has a single signal cable 205. In some embodiments, spine 210 may also comprise multiple spines. For example, when there are several signal cables, it may be desirable to use two or more spines to counteract the signal cables' resistance to bending or twisting.

Although specific embodiments of the invention have been described for purposes of illustration, it will be apparent to those skilled in the art that various modifications may be made without departing from the spirit and scope of the invention. Accordingly, the invention should not be limited except as by the appended claims.

What is claimed is:

1. A cable assembly for an electrical test probe, comprising:
   a probe tip;
   a signal cable, the signal cable having a first end connected to the probe tip, and a second end connected to an instrument cable; and
   a pliable spine substantially parallel and adjacent to the signal cable and configured to retain an altered position of the signal cable when the signal cable is bent or twisted from an original position of the signal cable, the pliable spine having a first end and a second end, the first end anchored to the probe tip to prevent the first end of the pliable spine from moving with respect to the probe tip,
   wherein the signal cable is outside the pliable spine.

2. The cable assembly of claim 1, further comprising a flexible housing that secures the pliable spine to the signal cable.

3. The cable assembly of claim 1, further comprising a flexible boot that surrounds the signal cable and the pliable spine, the flexible boot extending from the probe tip to the instrument cable, and the flexible boot having cut out sections to allow the boot to flex within an allowable bend radius of the signal cable.

4. The cable assembly of claim 3, wherein the cross-sectional area of the flexible boot reduces towards the probe tip such that the cable assembly has the greatest range of motion at the probe tip.

5. The cable assembly of claim 3, wherein the pliable spine is integral to the flexible boot.

6. The cable assembly of claim 5, wherein the pliable spine is inserted into a channel in the flexible boot.

7. The cable assembly of claim 5, wherein the pliable spine is molded into the flexible boot.

8. The cable assembly of claim 1, wherein the signal cable is a coaxial cable.

9. The cable assembly of claim 1, wherein the pliable spine comprises a metal wire.

10. The cable assembly of claim 1, wherein the pliable spine comprises a copper wire.

11. The cable assembly of claim 1, wherein the pliable spine comprises a wire having a wire gauge of about 20 AWG (American Wire Gauge).

12. The cable assembly of claim 1, wherein the pliable spine includes one or more anchors or bends between the first end and the second end to prevent the signal cable from moving with respect to the pliable spine at each respective anchor or bend.

* * * * *